United States Patent
Nagae et al.

(10) Patent No.: US 7,851,020 B2
(45) Date of Patent: Dec. 14, 2010

(54) DROPLET DISCHARGE METHOD, ELECTRO-OPTIC DEVICE, AND ELECTRONIC APPARATUS

(75) Inventors: Nobuaki Nagae, Chino (JP); Kazumi Aruga, Fujimi (JP)

(73) Assignee: Seiko Epson Corporation (JP)

( * ) Notice: Subject to any disclaimer, the term of this patent is extended or adjusted under 35 U.S.C. 154(b) by 390 days.

(21) Appl. No.: 11/423,188

(22) Filed: Jun. 9, 2006

(65) Prior Publication Data

US 2006/0279200 A1 Dec. 14, 2006

(30) Foreign Application Priority Data

Jun. 10, 2005 (JP) ............... 2005-170463

(51) Int. Cl.
*B05D 5/00* (2006.01)

(52) U.S. Cl. ............... 427/256; 427/427.1; 427/427.3; 347/12; 347/15; 347/40; 347/43; 347/69; 349/104; 349/108

(58) Field of Classification Search ............... 427/256, 427/427.1, 427.3; 347/12, 15, 40, 43, 69, 347/70; 349/104, 108
See application file for complete search history.

(56) References Cited

U.S. PATENT DOCUMENTS

| | | | |
|---|---|---|---|
| 6,874,883 | B1 | 4/2005 | Shigemura et al. |
| 6,948,795 | B2 * | 9/2005 | Tashiro et al. ............... 347/40 |
| 6,991,315 | B2 | 1/2006 | Nakamura et al. |
| 7,125,096 | B2 | 10/2006 | Usui |
| 7,270,846 | B2 | 9/2007 | Shigemura et al. |
| 7,381,444 | B2 | 6/2008 | Shigemura et al. |

| | | |
|---|---|---|
| 2006/0028499 A1 | 2/2006 | Nakamura et al. |

FOREIGN PATENT DOCUMENTS

| | | |
|---|---|---|
| CN | 1422747 A | 6/2003 |
| JP | 6-286223 | 10/1994 |
| JP | 09-138306 | 5/1997 |
| JP | 2003-329828 | 11/2003 |
| JP | 2004-267927 | 9/2004 |
| JP | 2005-095833 | 4/2005 |
| JP | 2005-095834 | 4/2005 |
| JP | 2005-095835 | 4/2005 |
| KR | 2004-84827 | 10/2004 |

* cited by examiner

*Primary Examiner*—Michael Kornakov
*Assistant Examiner*—Xiao Zhao
(74) *Attorney, Agent, or Firm*—Harness, Dickey & Pierce, P.L.C.

(57) ABSTRACT

A method for discharging droplets includes: discharging droplets of a plurality of variations of functional liquids by a plurality of discharge heads, on a coated area from a plurality of nozzles installed in each of the discharge heads, while scanning relatively over the coated area provided on a substrate; wherein a location of the nozzles is shifted in an orthogonal direction for each of the discharge heads, the nozzles being installed in an orthogonal direction on both edges whose direction is approximately orthogonal to a scanning direction, and, at the same time, the plurality of nozzles being arranged in each of the discharge heads, so that an overlapped discharge area, where discharge areas of all variations of the functional liquid overlap upon scanning, is formed; and wherein the discharge heads perform scanning so that the overlapped discharge area includes at least part of the coated area that is provided along a side that extends in the scanning direction, when discharging droplets of the functional liquid on the coated area that is provided along the side that extends in the scanning direction, the discharge heads being located on the edge of the orthogonal direction in the substrate.

14 Claims, 13 Drawing Sheets

DROPLET DISCHARGE METHOD, ELECTRO-OPTIC DEVICE, AND ELECTRONIC APPARATUS

BACKGROUND

1. Technical Field

The present invention relates to a method for discharging droplets, as well as to an electro-optic device and an electronic apparatus.

2. Related Art

Droplets discharging head of inkjet printers allows a discharge of very fine ink droplets in dots, providing excellent precision in the size of ink droplets and the evenness of pitches. This technique is applied in the field of manufacturing various products. For instance, the technique is applied in forming color filters of liquid crystal devices, or light emitting units of organic electroluminescence display devices. More specifically, the droplet discharge head is supplied with a functional liquid such as special ink or photosensitive resinous solution, and it discharges the droplets of the functional liquid toward a substrate for an electro-optic device (for instance, refer to JP-A-2004-267927). The color filters and light emitting units formed in such a method are frequently provided with several variations of colors. Therefore, several kinds of functional liquids are discharged on a substrate, one at a time, by different devices.

As described, on the membranous color filter layers and light emitting units formed in the above method, several variations of colors are frequently provided. In the device described in JP-A-2004-267927, several kinds of functional liquids are discharged on a substrate, one at a time, by different devices, resulting in a longer duration of discharge. In order to discharge all variations of liquid material in one scan using one device, so as to shorten the discharge duration, one method, for example, may be: arranging the heads (in which nozzles for discharging various liquid materials are installed) so that the arrangement of the nozzles are aligned, and discharging the liquid materials simultaneously from each head in one scan.

However, when discharging the liquid materials from the head, uneven coating lines may occur, particularly for the liquid materials discharged from the nozzles installed on both ends of the heads. Therefore, if the both ends of each of the head are aligned, the locations of the uneven coating lines caused by the liquid materials discharged from each head overlap. This makes the uneven coating lines of the liquid materials all the more conspicuous in the entire substrate.

SUMMARY

The advantage of the present invention is to provide: a droplet discharge method that allows making the unevenness of the functional liquids less conspicuous over the entire substrate; as well as an electro-optic device and an electronic apparatus.

In order to achieve the above advantage, according to a first aspect of the invention, a method for discharging droplets includes discharging droplets of a plurality of variations of functional liquids by a plurality of discharge heads, on a coated area from a plurality of nozzles installed in each of the discharge heads, while scanning relatively over the coated area provided on a substrate; wherein a location of the nozzles is shifted in an orthogonal direction for each of the discharge heads, the nozzles being installed in an orthogonal direction on both edges whose direction is approximately orthogonal to a scanning direction, and, at the same time, the plurality of nozzles being arranged in each of the discharge heads, so that an overlapped discharge area, where discharge areas of all variations of the functional liquid overlap upon scanning, is formed; and wherein the discharge heads perform scanning so that the overlapped discharge area includes at least part of the coated area that is provided along a side that extends in the scanning direction, when discharging droplets of the functional liquid on the coated area that is provided along the side that extends in the scanning direction, the discharge heads being located on the edge of the orthogonal direction in the substrate.

With the above aspect of the invention, the location where the uneven coating line is likely to occur in each of the discharge heads, or in other words, the location of the nozzles installed in both ends of the discharge head, is shifted for each of the discharge heads. Hence, the locations of the uneven coating lines of the functional liquid discharged from each of the discharge heads do not overlap, when discharging the functional liquid while using the head unit that is in accordance with the above aspect of the invention to scan over the substrate.

In the case where the nozzles are shifted as described above, the discharge regions do not overlap for each of the discharge heads. Hence, only one, or some of the variations of functional liquids are discharged on the coating area provided on the edge side of the orthogonal direction in the substrate. In this case, the scan needs to be repeated twice or three times, which is very inefficient, just in order to discharge other types of functional liquids that have not been discharged on the needed area in the first scan.

According to the above aspect of the invention, the discharge head performs scanning so that the overlapped discharge area includes at least a part of the coated area, when discharging the functional liquid to the coated area provided on the edge side of the orthogonal direction in the substrate. Thus, one scan allows the discharge of all types of functional liquids. This provides an advantage of avoiding an inefficient scanning.

It is preferable that, in the droplet discharge method, a size of the overlapped discharge area in the orthogonal direction be larger than the size of the coated area in the orthogonal direction.

This allows the discharge area to include the coated area. Consequently, one scan allows the discharge of the functional liquid on the entire coated area provided on the edge side of the orthogonal direction in the substrate, voiding the discharge on the same coated area two or three times. This also means that no time lag exists in the case of discharging on a coated area once and discharging on the same coated area again in the next scan, thereby allowing a prevention of uneven drying of the functional liquid, caused by the discharge time lag.

It is preferable that, in the droplet discharge method, the coated area that is provided on an edge side of the substrate in the orthogonal direction be discharged first, when discharging the functional liquid on the coated area.

By discharging the functional liquid first on the coated areas that are provided on the edge side of the substrate, the adjustment of the location of the discharge heads during the later scanning over other coated areas, becomes easier, allowing an efficient scanning.

According to a second aspect of the invention, an electro-optic device includes a substrate on which a functional liquid is discharged by the droplet discharge method.

Since, according to the first aspect of the invention, the droplet discharge of the functional liquid is performed by the droplet discharge method that allows reducing the unevenness of the functional liquid over the entire substrate, a high quality electro-optic device with an even display property can be obtained.

According to a third aspect of the invention, an electronic apparatus is mounted with the above-mentioned electro-optic device.

This allows obtaining an electronic apparatus that has excellent display functionality.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will now be described with references to the accompanying drawings. The following figures have different scale sizes for each of the components, so that each of them will be sufficiently large enough to be recognized in the figures.

Electro-Optic Device

Figure 1:
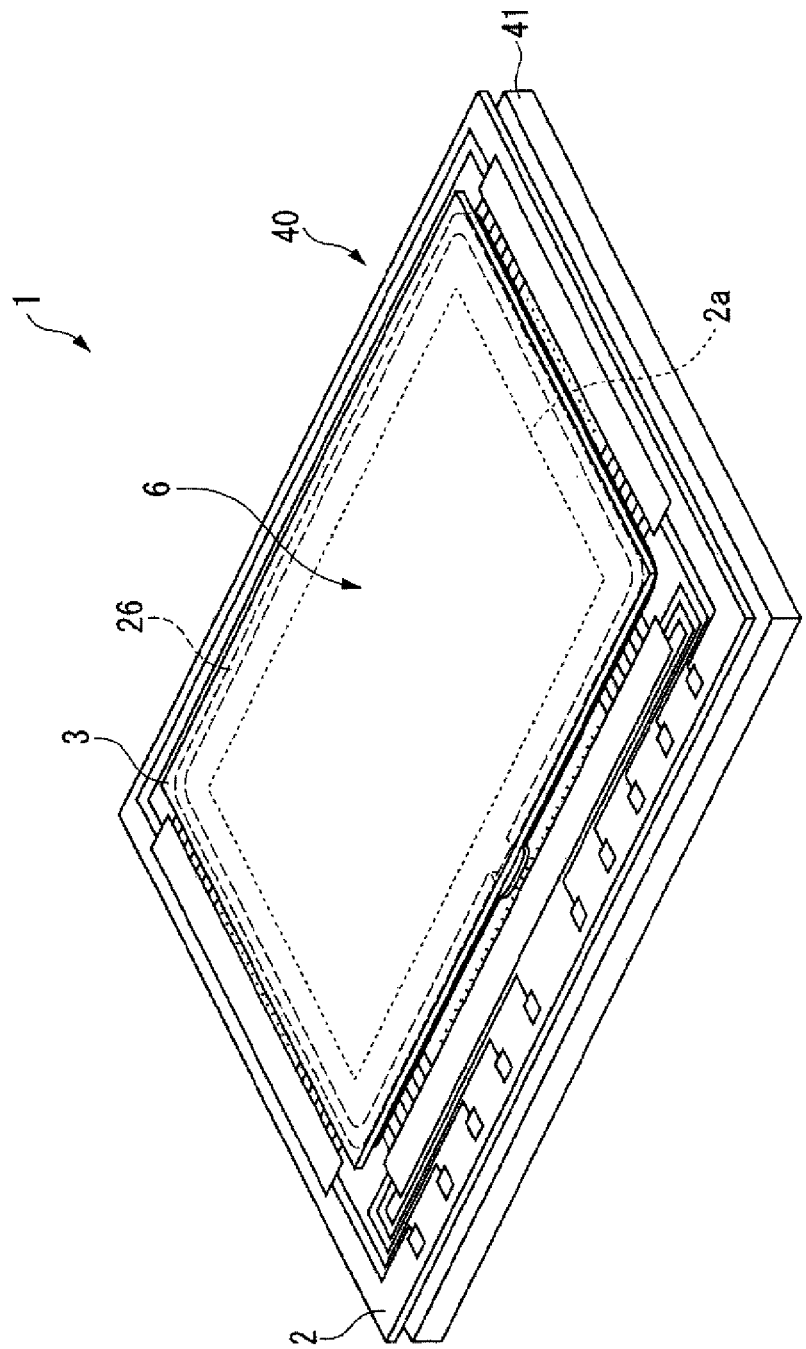
FIG. 1 is an oblique drawing illustrating a structure of a liquid crystal device according to an embodiment of the invention.

FIG. 1 is an oblique drawing illustrating the structure of a liquid crystal device 1 in the embodiment.

As shown in this figure, the liquid crystal device 1 includes a liquid crystal panel 40 and a backlight 41 as main components. The liquid crystal panel 40 has a structure, where an active matrix substrate 2 and a color filter substrate 3 are adhered via a sealing material 26, and in between the active matrix substrate 2, the color filter substrate 3, and the sealing material 26, liquid crystal 6 is sandwiched. The display region 2a indicated in a dotted line in the figure is a region where images or movies are displayed.

The liquid crystal device 1, according to this embodiment, employs an active matrix liquid crystal device using a thin film diode (TFD) element (a two-terminal nonlinear component) as a switching device. However, liquid crystal device 1 may also employ a thin film transistor (TFT) as the switching element, or it may also be a passive matrix liquid crystal device. Further, the liquid crystal panel 40 is formed by adhering two large-sized motherboards and sawing the adhered motherboards (so-called "multi-paneling"). Out of the two motherboards, one is a color filter side motherboard with which the color filter substrate 3 is produced, and the other is an active matrix side motherboard with which the active matrix substrate 2 is produced.

Figure 2A:
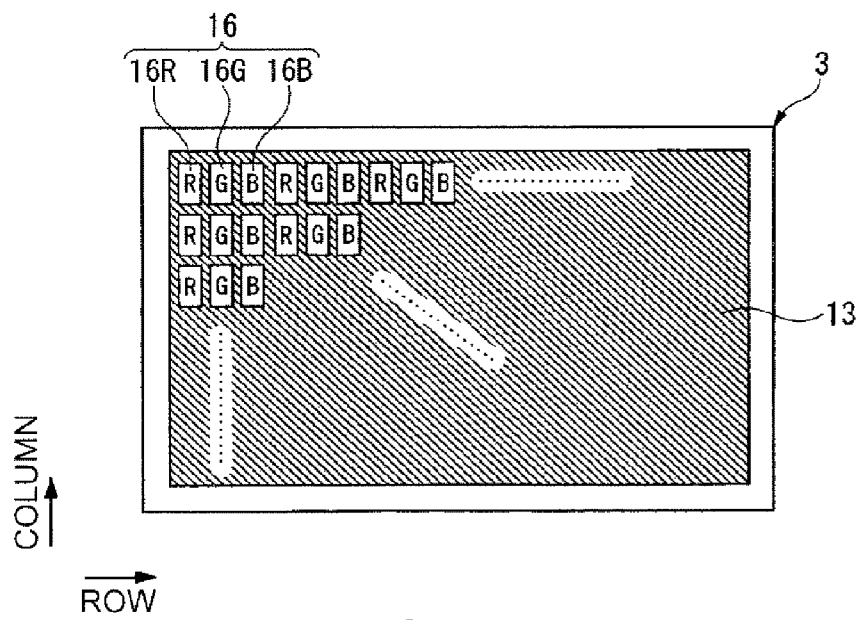
FIGS. 2A and 2B are top view drawing illustrating the structure of a color filter substrate according to the embodiment.
Figure 2B:
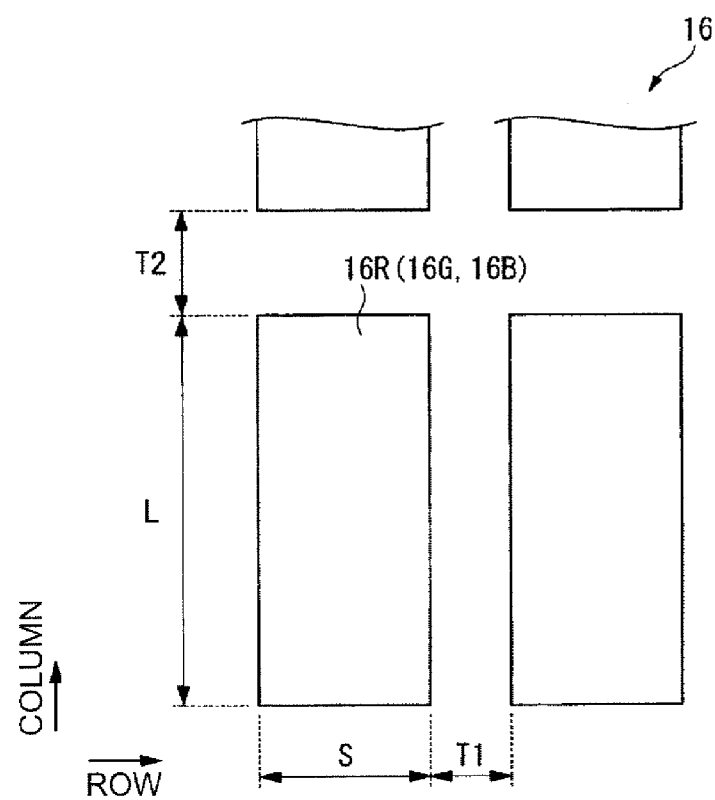

FIGS. 2A and 2B are top view drawings illustrating the structure of the color filter substrate 3. FIG. 2A is a top view drawing illustrating the entire structure of the color filter substrate 3, and FIG. 2B is a magnified drawing illustrating part of the color filter substrate 3.

As shown in FIG. 2A, the color filter substrate 3 is a rectangular substrate formed with a transparent material such as, for example, glass or plastic. An opaque layer 13 is provided on the color filter substrate 3, and a color filter 16, which includes one each, of red layers 16R, green layers 16G, and blue layers 16B, is provided corresponding to the area (pixel) surrounded by the opaque layer 13. An over-coating layer (not shown) is formed on the color filter substrate 3, so as to cover the color filters 16, and an orientation film (not shown) is formed on the over-coating layer. The orientation film is a horizontal orientation film, formed with, for instance, polyimide and the like, having a rubbed surface.

Moreover, as shown in FIG. 2B, each of the red layers 16R (or the green layers 16G, or the blue layers 16B) has a rectangular shape that has a shorter side whose length is S (where S is, for instance, approximately 170 μm), and a longer side whose length is L (where L is, for instance, approximately 510 μm). The interval T1 between the adjacent layers in the direction of row is approximately 20 μm, and the interval T2 in the direction of column is approximately 40 μm.

Droplet Discharge Device

The droplet discharge device 100 (hereafter referred to as "discharge device"), according to the embodiment, will now be described.

Figure 3:
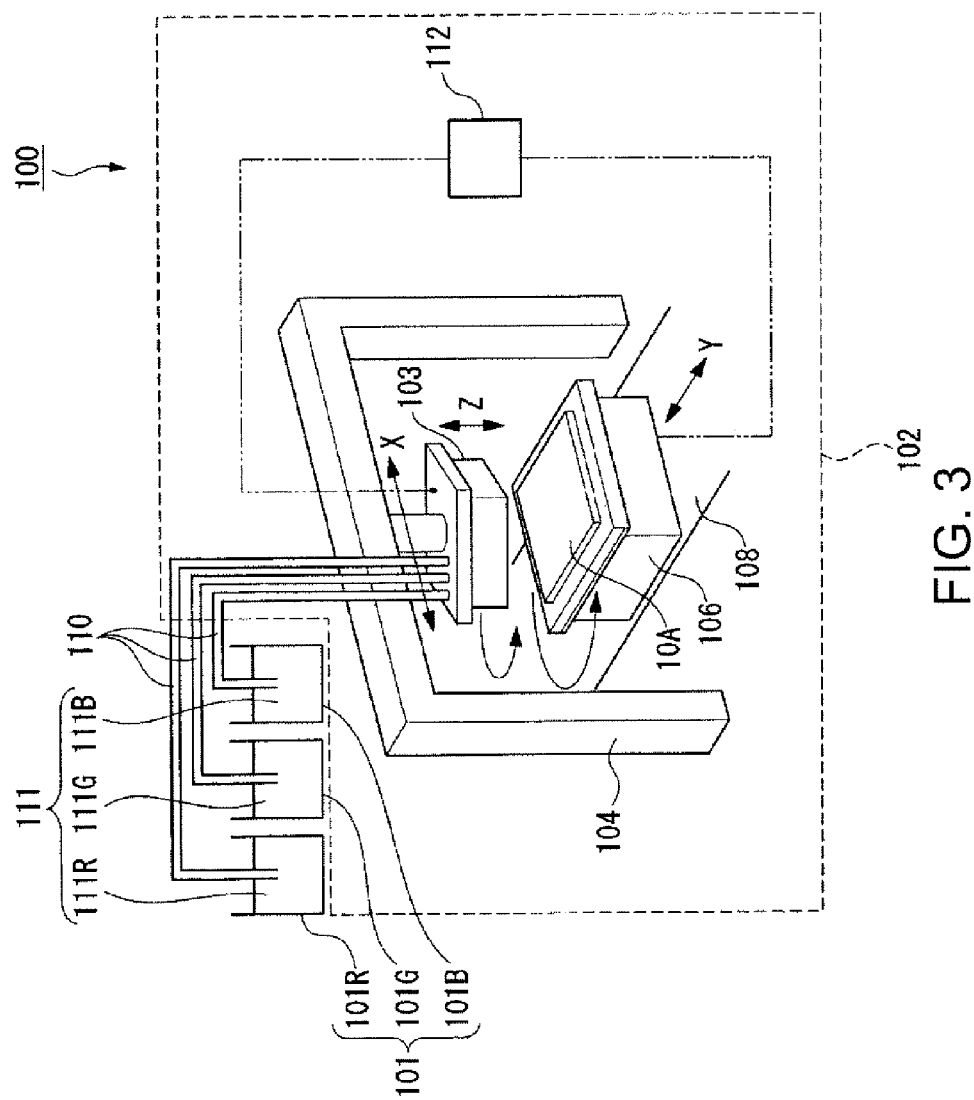
FIG. 3 is an oblique drawing illustrating the entire structure of the droplet discharge device according to the embodiment.

As shown in FIG. 3, the discharge device 100 includes tanks 101 that retains a liquid material 111, and a discharge scan unit 102 to which the liquid material 111 is supplied from the tanks 101 via tubes 110.

There are, for instance, three types of materials for liquid materials 111: a material that constitutes the red layers 16R of the color filters 16 in the above-mentioned liquid crystal device 1 (hereafter referred to as "red color material 111R"), a material that constitutes the green layers 16G (hereafter referred to as "green color material 111G"), and a material that constitutes the blue layers 16B (hereafter referred to as "blue color material 111B").

The tanks 101 include a red color material tank 101R that retains the red color material 111R, a green color material tank 101G that retains the green color material 111G, and a blue color material tank 101B that retains the blue color material 111B, each containing the three types of liquid materials 111 described above. A pressure pump (not shown), for instance, is installed to each of the tanks 101. The pressure pumps operate and apply pressure on the interior of the tanks 101, thereby supplying the liquid materials 111 from the tanks 101 to the discharge scan unit 102.

A solution used for the red color material 111R is prepared, for instance, by diffusing an inorganic pigment (for example, red iron oxide III or cadmium, etc.) into a polyurethane oligomer, thereafter adding butyl carbitol acetate as a solvent, further adding nonionic surface active agent as a disperser, in order to adjust its viscosity to a prescribed range.

A solution used for the green color material 111G is prepared, for instance, by diffusing an inorganic pigment (for example, chromium oxide green or cobalt green, etc.) into a polyurethane oligomer, thereafter adding cyclohexanone and butyl acetate as solvents, further adding nonionic surface active agent as a disperser, in order to adjust its viscosity to a prescribed range.

A solution used for the blue color material 111B is prepared, for instance, by diffusing an inorganic pigment (for example, ultramarine blue or iron blue, etc.) into a polyurethane oligomer, thereafter adding butyl carbitol acetate as a solvent, further adding nonionic surface active agent as a disperser, in order to adjust its viscosity to a prescribed range.

The discharge scan unit 102 includes: a carriage 103 that holds a plurality of heads 114 (refer to FIG. 4); a carriage location control device 104 that controls the location of the carriage 103; a stage 106 that holds a substrate 10A that constitutes the color filter side motherboard; a stage location control device 108 that controls the location of the stage 106; and a control unit 112. The discharge device 100 actually is provided with a plurality of (for example, 10) carriages 103. In FIG. 3, only one of the carriages 103 is shown in order to simplify the explanation.

The carriage location control device 104 moves the carriage 103 along the direction of the X-axis or the Z-axis, in accordance with signals from the control unit 112. It also has a function to rotate the carriage 103 in the direction where the Z-axis is a rotation axis. The stage location control device 108 moves the stage 106 along the direction of the Y-axis, in accordance with the signals from the control unit 112. It also has a function to rotate the stage 106 in the direction where the Z-axis is a rotation axis.

As described above, the carriage 103 moves along the direction of the X-axis, controlled by the carriage location control device 104. The stage 106 moves along the direction of the Y-axis, controlled by the stage location control device 108. In other words, the relative location of the heads 114 to the stage 106 is changed by the carriage location control device 104 and the stage location control device 108.

More specifically, by moving both or one of the carriage 103 and the stage 106, the carriage 103 can scan the stage 106 (or the substrate 10A held by the stage 106). Hereafter, a case of performing the scan by moving the stage 106 and fixing the carriage 103 will be described.

Figure 4:
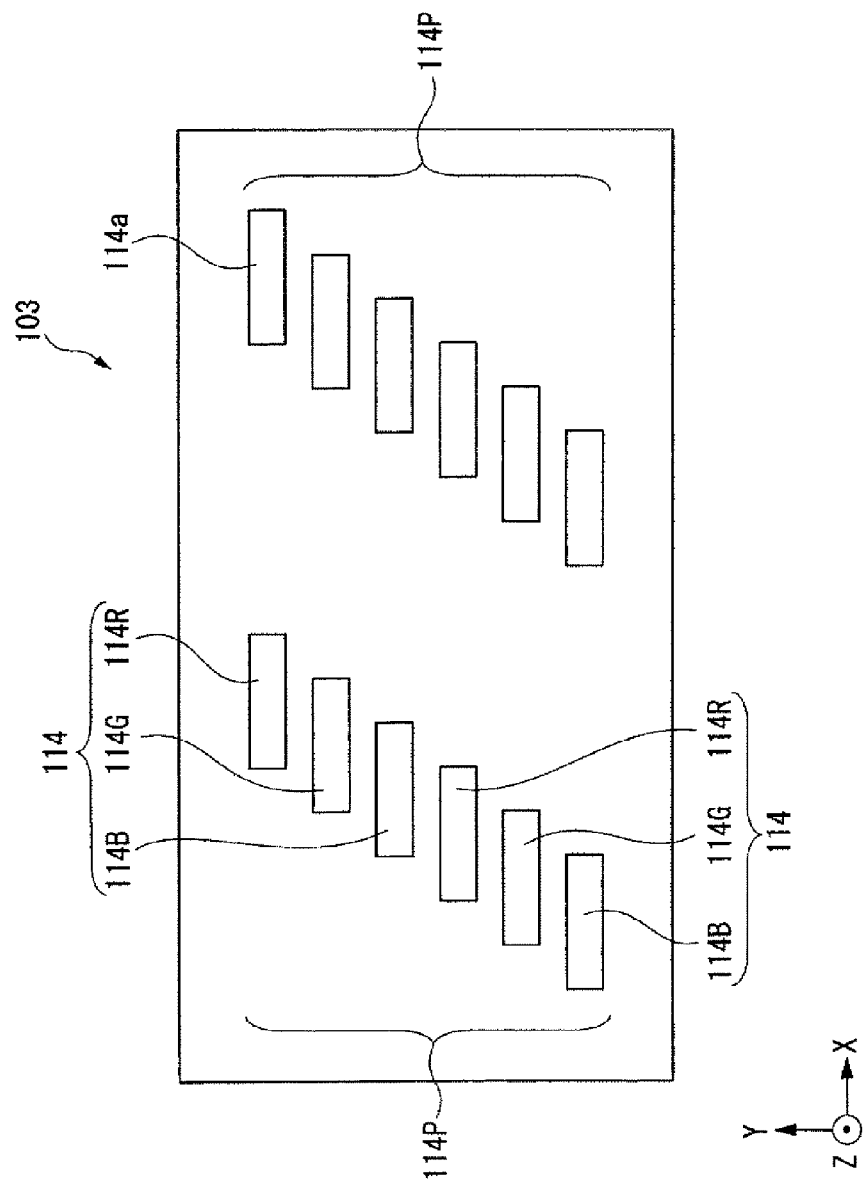
FIG. 4 is a top view drawing illustrating the structure of the carriage of the droplet discharge device according to the embodiment.

FIG. 4 is a drawing of one carriage 103 observed from the side of the stage 106, and the direction vertical to the surface of the paper on which the figure is drawn, is the direction of the Z-axis. Moreover, the lateral direction of the paper where FIG. 4 is drawn is the X-axis, and the top-down direction of the paper is the Y-axis.

As shown in FIG. 4, the carriage 103 holds the plurality of heads 114 that have the same structure and size. There are three types of heads 114: heads 114R that discharge the red color material 111R which is one of the liquid materials 111; heads 114G that discharge the green color material 111G; and heads 114B that discharge the blue color material 111B.

In this embodiment, one carriage 103 has heads 114R, heads 114G, and heads 114B (four each), all together twelve heads 114. The details of the relation of the heads 114 will be described later. In this document, the four adjacent heads 114 in the direction of Y-axis may also be referred to as "head group 114P".

Figure 5:
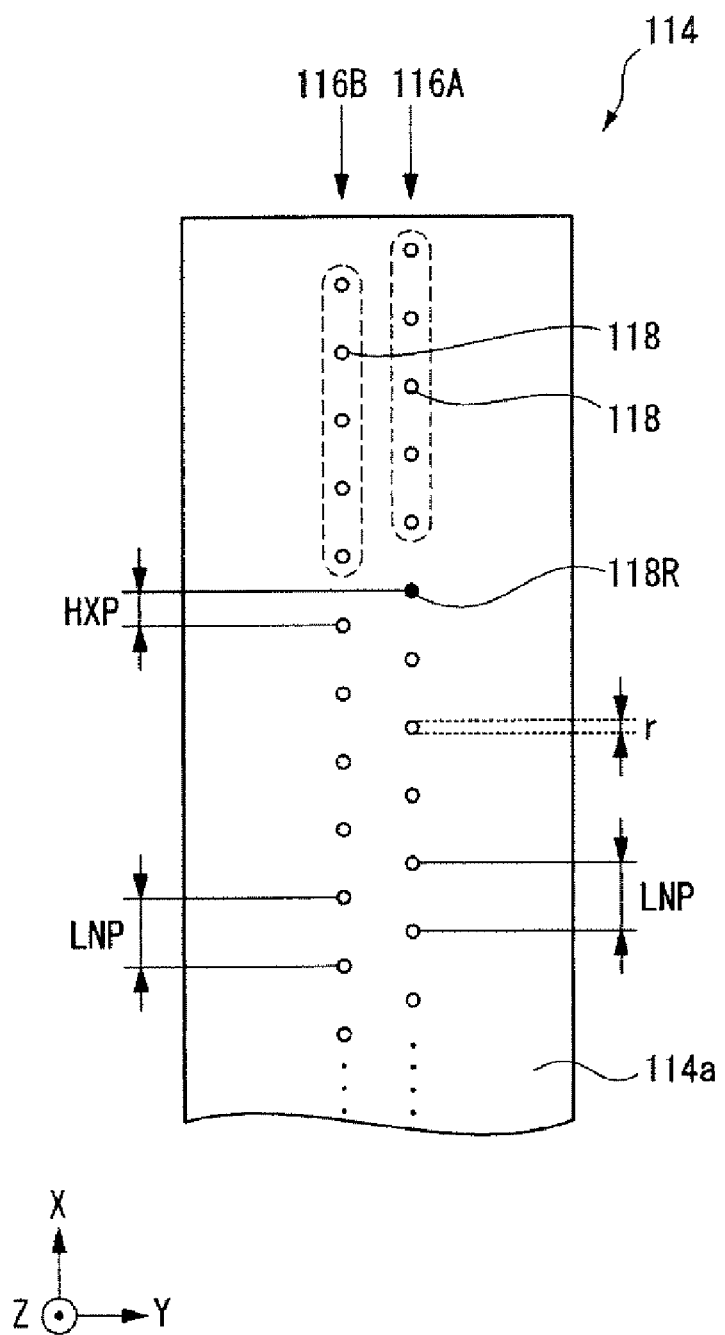
FIG. 5 is a top view drawing illustrating the external structure of each head of the droplet discharge device according to the embodiment.

FIG. 5 is a drawing illustrating a bottom surface 114a of one of the heads 114. The shape of the bottom surface 114a is rectangular, having two longer sides and two shorter sides, each of them facing each other. The bottom surface 114a faces the stage 106 side (direction of the Z-axis in the figure). The longer sides of the heads 114 and the direction of the X-axis, as well as the shorter sides of the heads 114 and the direction of the Y-axis, are parallel.

Nozzles 118 are arranged in two rows, i.e. a row 116A and a row 116B (for example, 90 each) on the bottom surface 114a in the direction of the X-axis. Moreover, the diameter of each of the nozzles 118 is approximately 30 μm. The nozzles 118 on the row 116A side and the nozzles 118 on the row 116B side are both arranged in a prescribed pitch LNP (LNP is approximately 140 μm) in each of the rows. The locations of the nozzles 118 in the row 116B are arranged so that they are shifted in the negative direction of the X-axis (downward in FIG. 5) by half the length of the pitch LNP (approximately 70 μm), in relation to each of the locations of the nozzles 118 in the row 116A. Here, the number of rows provided in the heads 114 is not limited to two. There may be up to 3, 4, . . . M rows (where M is a positive integer), or there may be one row.

There are 180 nozzles in one of the heads 114, consisting of the row 116A and the row 116B each containing 90 nozzles. However, the five nozzles closest to both ends in the row 116A are configured not to discharge the liquid material 111, and are called "cessation nozzles" (the area surrounded with a dotted line in FIG. 5). Similarly, the five nozzles closest to both ends in the row 116B are also configured as the cessation nozzles, not discharging the liquid material 111 (the area surrounded with a dotted line in FIG. 5). This means that, aside from the above-mentioned 20 nozzles on both edges, 160 out of 180 nozzles 118 installed in each of the heads 114 are configured to discharge the liquid material 111 hereafter referred to as "discharge nozzles").

Figure 6:
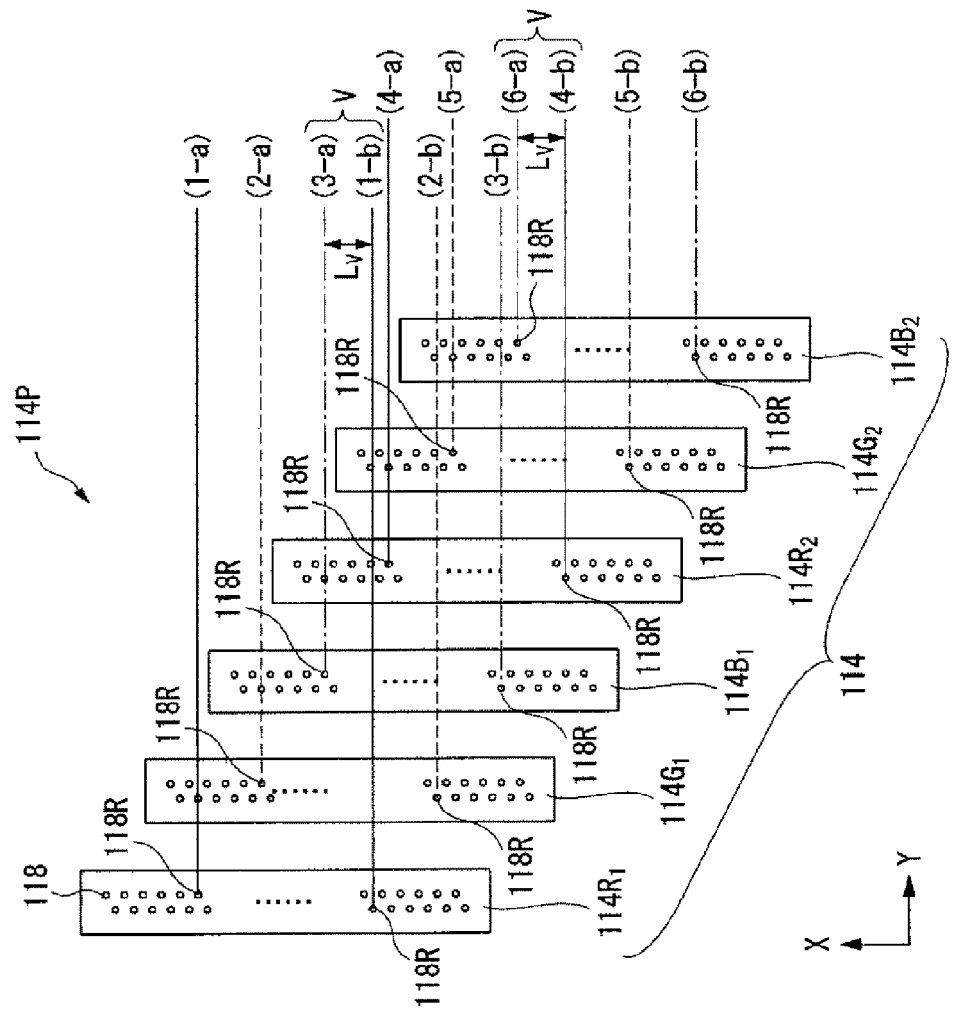
FIG. 6 is a drawing illustrating the internal structure of the head of the droplet discharge device according to the embodiment.

In this document, the sixth nozzle from the edge out of 90 nozzles 118 in the row 116A is noted as "reference nozzle 118R", in order to describe the relationship of the locations of the heads 114. In the figure, it is indicated as the sixth nozzle from the top. In other words, out of 80 discharge nozzles in the row 116A, the discharge nozzle located at the top most part in FIG. 6 is the "reference nozzle 118R" in one of the heads 114. As long as the way of determining the "reference nozzle 118R" is the same for all the heads 114, the location of the "reference nozzle 118R" does not have to be as explained above.

The relation of locations of the six heads 114 in the head group 114P will now be described.

FIG. 6 is a drawing illustrating the relation of the relative locations of the heads 114. In FIG. 6, the two sets of heads 114R, 114G, and 114B shown in FIG. 4 are distinguished by noting them as heads $114R_1$, $114G_1$, $114B_1$, and heads $114R_2$, $114G_2$, $114B_2$.

As shown in FIG. 6, the head group 114P is arranged so that the adjacent heads 114 are shifted from each other in the direction of the X-axis. The head $114G_1$ adjacent to the head $114R_1$ is installed, for instance, shifted downward in the direction of X, in relation to the head $114R_1$. Similarly, the head $114B_1$ adjacent to the head $114G_1$ is also installed, for instance, shifted downward in the direction of X, in relation to the adjacent head $114G_1$. The same applies for the head $114R_2$ adjacent to the head $114B_1$, the head $114G_2$ adjacent to the head $114R_2$, and the head $114B_2$ adjacent to the head 114G$_2$, the heads 114 being installed so that each of them is shifted downward in the direction of the X-axis in relation to its adjacent head 114.

Moreover, in FIG. 6, the locations of the reference nozzles 118R installed in the head 114R$_1$ in the direction of the X-axis are indicated as "1-*a*" and "1-*b*" (shown in solid lines). The locations of the reference nozzles 118R installed in the head 114G$_1$ in the direction of the X-axis are indicated as "2-*a*" and "2-*b*" (shown in dotted lines). The locations of the reference nozzles 118R installed in the head 114B$_1$ in the direction of the X-axis are indicated as "3-*a*" and "3-*b*" (shown in dashed lines). The locations of the reference nozzles 118R installed in the head 114R$_2$ in the direction of the X-axis are indicated as "4-*a*" and "4-*b*" (shown in solid lines). The locations of the reference nozzles 118R installed in the head 114G$_2$ in the direction of the X-axis are indicated as "5-*a*" and "5-*b*" (shown in dotted lines). The locations of the reference nozzles 118R installed in the head 114B$_2$ in the direction of the X-axis are indicated as "6-*a*" and "6-*b*" (shown in dashed lines).

Since the heads 114, having the same structure, are arranged in a manner so that they are shifted from each other in the direction of the X-axis, the locations of the reference nozzles 118R (1-*a*) through (6-*a*) are also shifted from each other. As a result, when the carriage 103 performs the scan, the uneven coating lines of the liquid material 111, discharged from the reference nozzles 118R (which is the edge of the nozzles 118), do not overlap.

Here, the areas on which the red color material 111R is discharged (the discharge area) are sandwiched by the reference nozzles 118R provided in the head 114R$_1$ and the 114R$_2$. In other words, the area sandwiched by the solid line (1-*a*) and the solid line (1-*b*), and the area sandwiched by the solid line (4-*a*) and the solid line (4-*b*) are the discharge areas. The discharge area of the green color material 111G is the area between the reference nozzles 118R provided in the head 114G$_1$ and the head 114G$_2$. In other words, the area sandwiched by the dotted line (2-*a*) and the dotted line (2-*b*), and the area sandwiched by the dotted line (5-*a*) and the dotted line (5-*b*) form the discharge areas. The discharge area of the blue color material 111B is the area between the reference nozzles 118R provided in the head 114B$_1$ and the head 114B$_2$. In other words, the area sandwiched by the dashed line (3-*a*) and the dashed line (3-*b*), and the area sandwiched by the dashed line (6-*a*) and the dashed line (6-*b*) form the discharge areas.

In FIG. 6, there are overlapped discharge areas V, where all three discharge areas for the red color material 111R, the green color material 111G, and the blue color material 111B overlap, when the carriage 103 performs the scan. More specifically, the area sandwiched by the dashed line (3-*a*) and the solid line (1-*b*), and the area sandwiched by the dashed line (6-*a*) and the solid line (4-*b*), are the overlapped discharge areas V. A size L$_v$ in the direction of the X-axis in the overlapped discharge areas V is larger than a size L in the direction of the X-axis in the coated areas 18S.

Figure 7A:
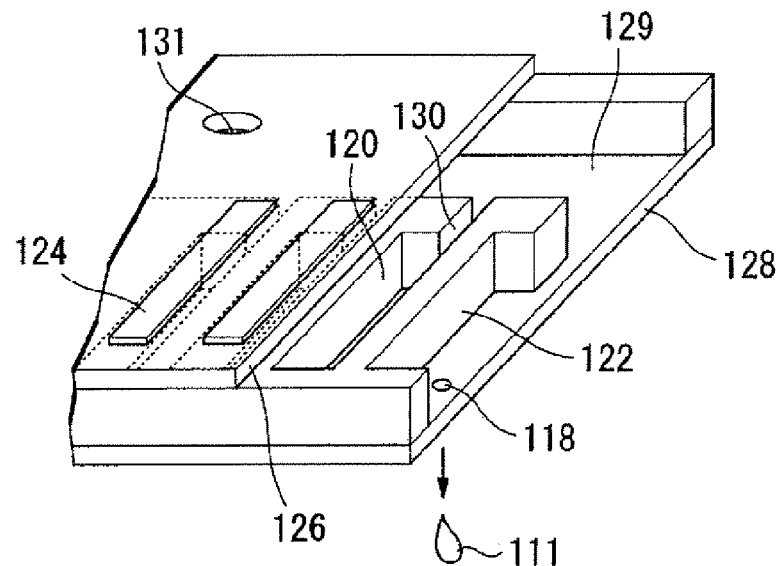
FIGS. 7A and 7B are block diagrams illustrating the structure of the control unit of the droplet discharge device according to the embodiment.
Figure 7B:
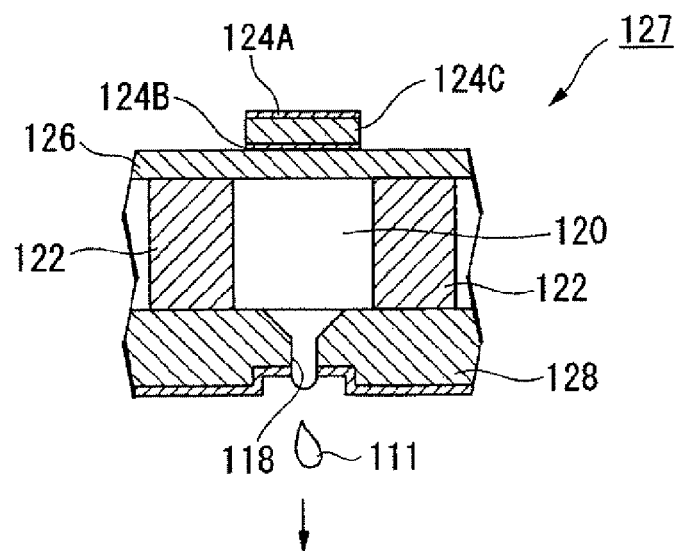

Hereafter, the internal structure of the heads 114 will be described. Each of the heads 114 is an inkjet head as shown in FIGS. 7A and 7B. More specifically, the head 114 is provided with a vibration plate 126 and a nozzle plate 128. A liquid retention pit 129 is installed between the vibration plate 126 and the nozzle plate 128, where the liquid material 111 is constantly filled in, supplied from the tanks 101 via a hole 131.

A plurality of isolation walls 122 is also installed between the vibration plate 126 and the nozzle plate 128. A part surrounded by the vibration plate 126, the nozzle plate 128, and a pair of isolation walls 122 is called a cavity 120. One cavity 120 is installed per nozzle 118; hence the number of cavities 120 and nozzles 118 is identical. The liquid material 111 is supplied to the cavity 120 from the liquid retention pit 129 via a supply mouth 130 installed between a pair of isolation walls 122.

A resonator 124 is placed corresponding to the cavity 120 on the vibration plate 126. The resonator 124 includes a piezo element 124C and a pair of electrodes 124A and 124B that sandwich the piezo element 124C. The liquid material 111 is discharged from the corresponding nozzles 118, by applying a drive voltage between the pair of electrodes 124A and 124B. Here, the shape of the nozzles 118 is adjusted so that the liquid material is discharged in the direction of the Z-axis from the nozzles 118. An electrothermal converter may also be included instead of the piezo element. In this structure, the liquid material 111 is discharged by utilizing the thermal expansion of the material caused by the electrothermal converter.

Hereafter, the structure of the control unit 112 will be described.

The control unit 112 comprehensively controls the actions of the liquid crystal device 1, such as: timings of discharging the liquid material 111, the location to fix the carriage 103 to, and the movement of the stage 106 (the speed and the distance of movement, etc.).

Figure 8:
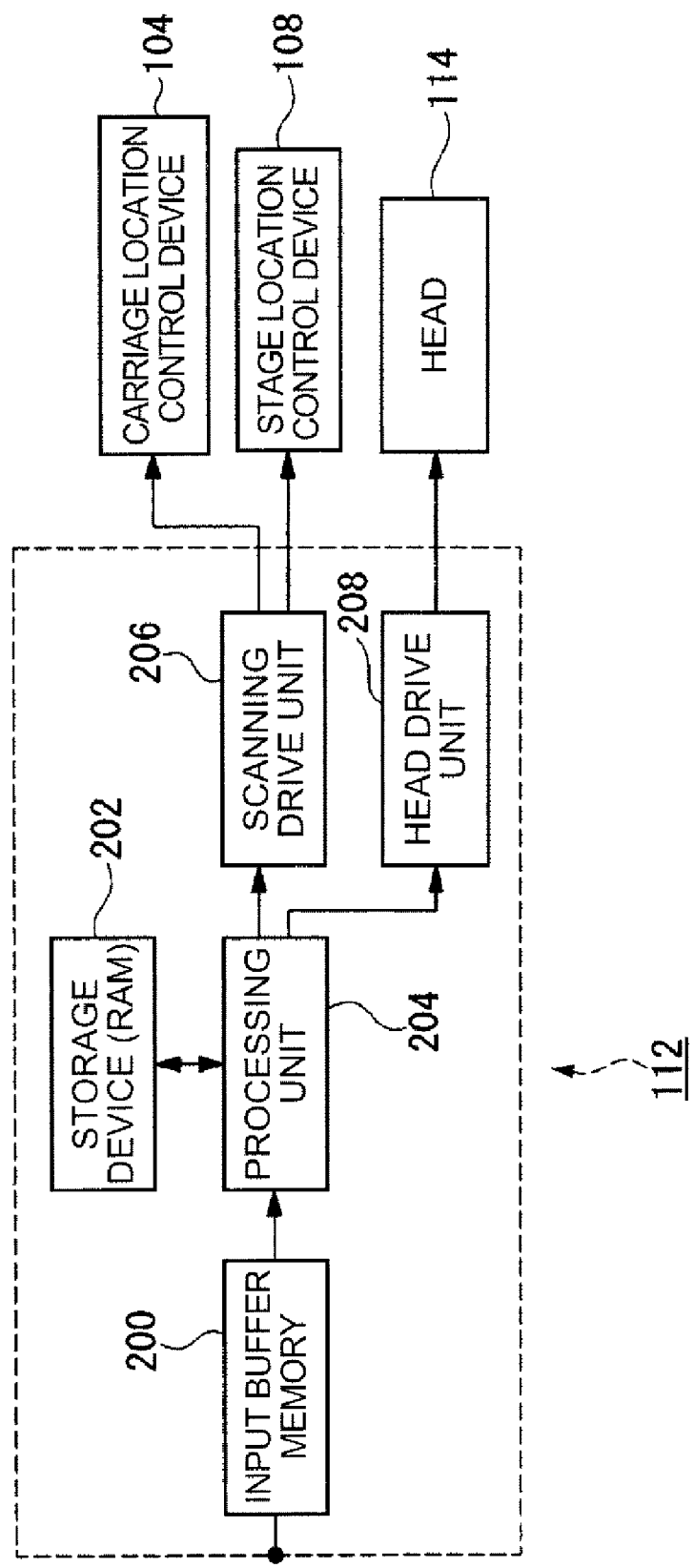
FIG. 8 is a drawing illustrating the structure of the head-driving unit of the droplet discharge device according to the embodiment.

As shown in FIG. 8, the control unit 112 is provided with an input buffer memory 200, a storage device 202, a processing unit 204, a scanning drive unit 206, and a head drive unit 208, all of them connected in order to allow communication.

The input buffer memory 200 receives data for discharge from, for instance, an information processing device or the like that is connected externally in order to conduct the discharge of the liquid material 111. The input buffer memory 200 supplies the data for discharge to the processing unit 204, and, in turn, the processing unit 204 stores the data for discharge in the storage device 202. RAM and the like may be used, for instance, as the storage device 202.

The processing unit 204 accesses the data for discharge stored in the storage device, and supplies necessary driving signals to the scanning drive unit 206 and the head drive unit 208, based on the data for discharge.

The scanning drive unit 206 supplies prescribed location control signals to the carriage location control device 104 and to the stage location control device 108, based on the driving signals. Moreover, the head drive unit 208 supplies discharge signals that discharge liquid material 111 to each of the heads 114, based on the driving signals.

Figure 9A:
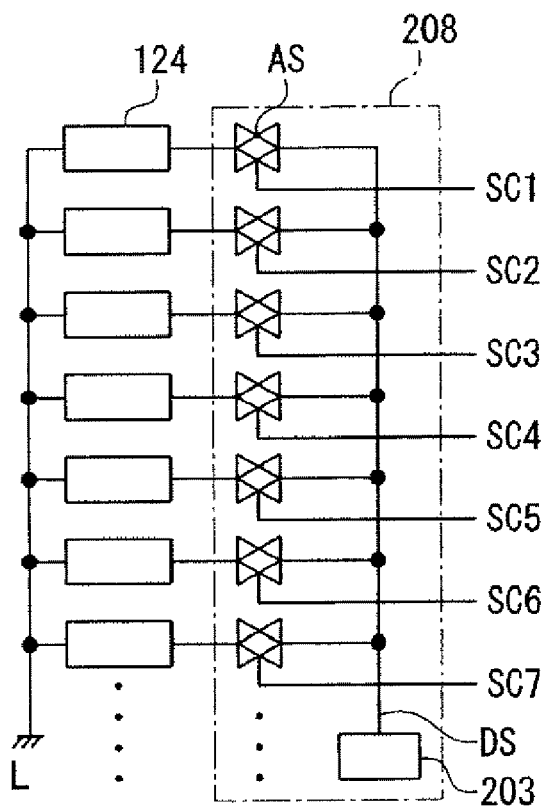
FIGS. 9A and 9B are drawings illustrating the arrangement of the heads of the droplet discharge device according to the embodiment.

As shown in FIG. 9A, the head drive unit 208 has one drive signal generation unit 203 and a plurality of analog switches AS. The analog switches AS are connected to the resonators 124 in the heads 114. More precisely, they are connected to the electrodes 124A (not shown in FIG. 9A). The analog switches AS are provided to each of the nozzles 118; hence there is the same number of analog switches AS as of the nozzles 118.

Figure 9B:
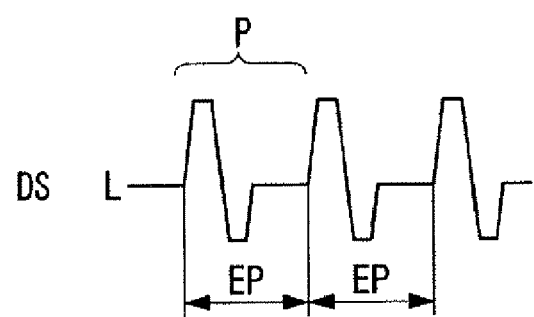

The drive signal generation unit 203 generates a drive signal DS, as shown in FIG. 9B. The drive signal DS is supplied independently to each of the input terminals of the analog switches AS. The electric potential of the drive signal DS deviates from the reference potential L with time. In other words, the drive signal DS includes a plurality of discharging waves P, repeated in a discharge cycle EP. The discharge cycle EP is adjusted to a desired value by, for instance, the processing unit 204.

The drive signal generation unit 203 is configured to allow outputting the drive signal DS only to a prescribed analog switches AS, and is able to control only the nozzles 118 that discharge the liquid material 111. It can also adjust the discharge cycle EP appropriately, and can generate discharge signals so that the liquid material 111 is discharged from the nozzles 118 in a prescribed order.

The Manufacturing Method of the Liquid Crystal Device (Droplet Discharge Method)

Hereafter, the manufacturing process of the liquid crystal device 1 having the aforementioned structure will be described.

In this embodiment, described is an exemplary method of forming a plurality of liquid crystal devices in a single batch using a large-sized motherboard, dividing it into liquid crystal devices 1 by sawing it.

First, a process for forming the color filter side motherboard will be briefly described.

The substrate 10A is stabilized to the stage 106 of the discharge device 100. The coated areas 18 (18R, 18G, 18B: refer to FIG. 10 and other relevant figures) are formed on the substrate 10A. The red layers 16R correspond to the coated areas 18R, the green layers 16G correspond to the coated areas 18G, and the blue layers 16B correspond to the coated areas 18B. Here, when stabilizing the substrate 10A to the stage 106, the location is adjusted so that the shorter sides of the substrate 10A match the direction of the X-axis, and the longer sides match the direction of the Y-axis.

Figure 10:
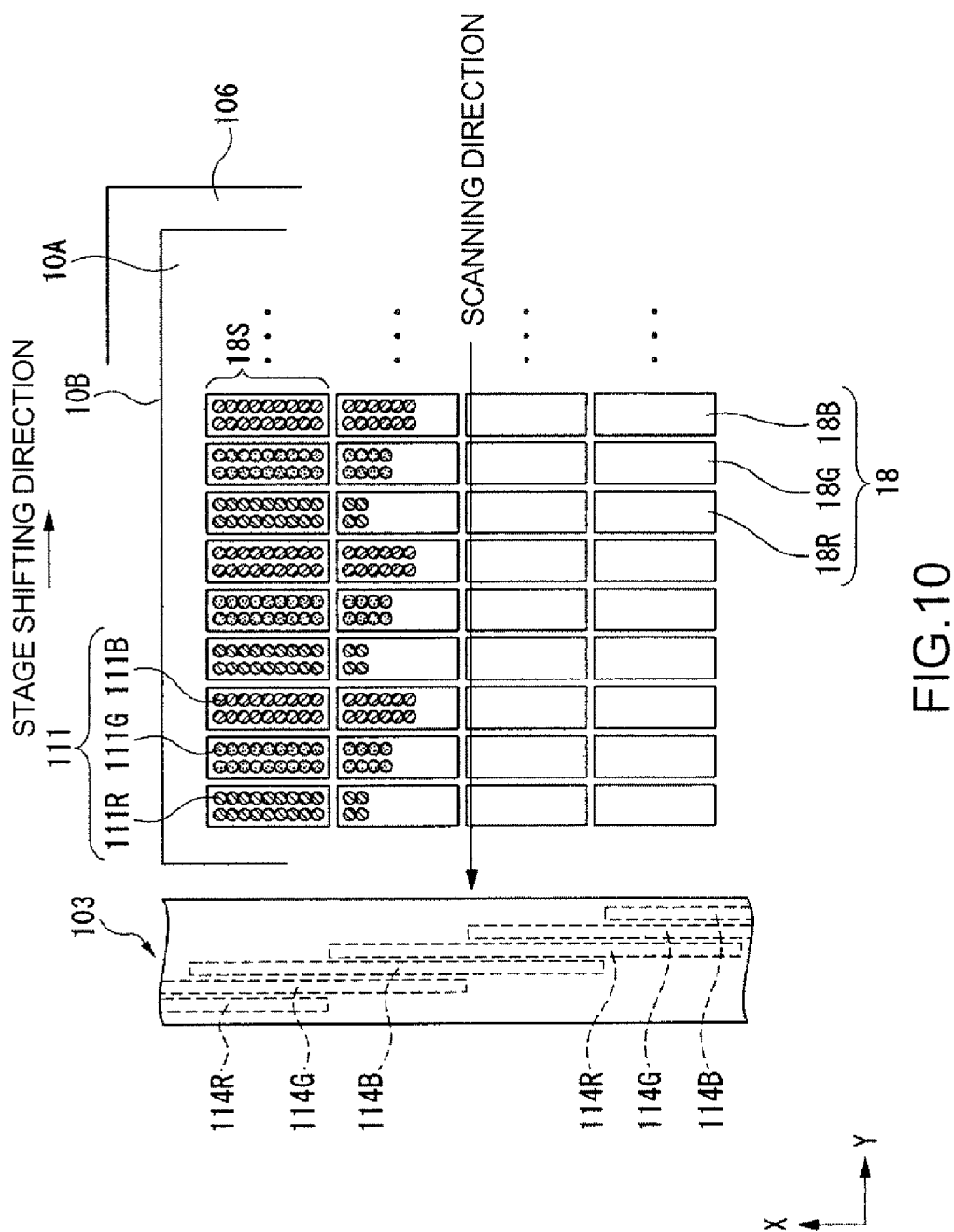
FIG. 10 is a first drawing illustrating a method for discharging droplets employed in the embodiment.

In the above state, as shown in FIG. 10, the stage 106 is moved from left to right in the figure. The carriage 103 scans over the substrate 10A from, for instance, right to left in the figure. Here, while the carriage 103 scans over the substrate 10A, each of the heads 114 discharges the liquid material 111. More specifically, the discharge takes place mainly in the coated areas 18S provided along a side edge 10B of the substrate 10A. The coated areas 18S are a part of the coated areas that are provided at the outer most side in the direction of the X-axis.

Figure 11:
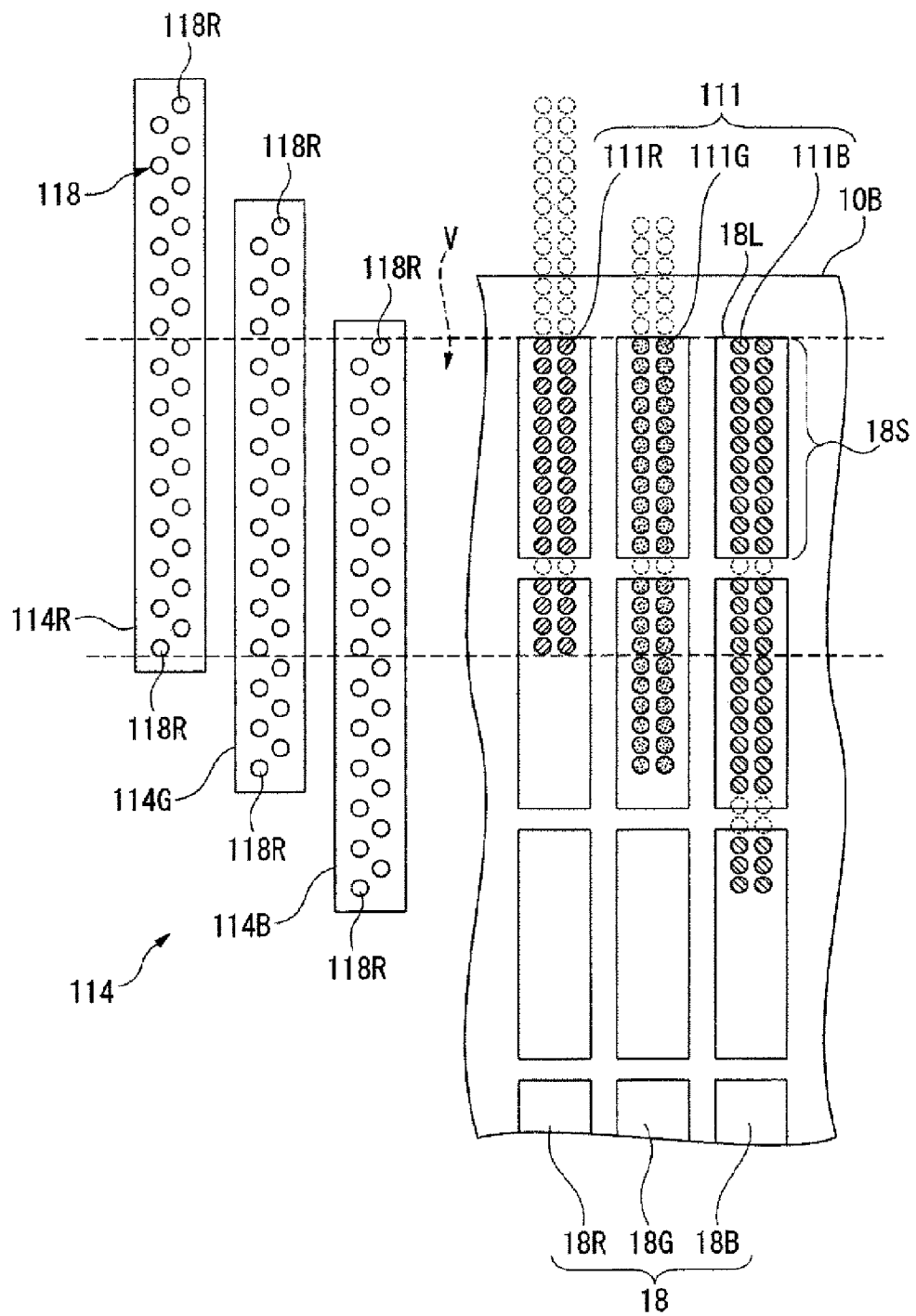
FIG. 11 is a second drawing illustrating a method for discharging droplets employed in the embodiment.

The detailed explanation of this initial scanning will follow with reference to FIG. 11. FIG. 11 is a drawing illustrating how the liquid material 111 is discharged from each of the heads 114. In order to simplify the description, the reference nozzle 118R is located at the edge of the heads 114 in the figure.

As shown in this figure, when performing the discharge to the coated areas 18S, the scan is performed so that the overlapped discharge areas V of the heads 114R, 114G, and 114B include all of the coated areas 18S, and the liquid material 111 (the red color material 111R, green color material 111G, and blue color material 111B) is discharge from the nozzles 118 that correspond to the coated areas 18S. The nozzles 118 arranged on the top part in the figure outside the overlapped discharge area V do not discharge the liquid material 111.

Figure 12:
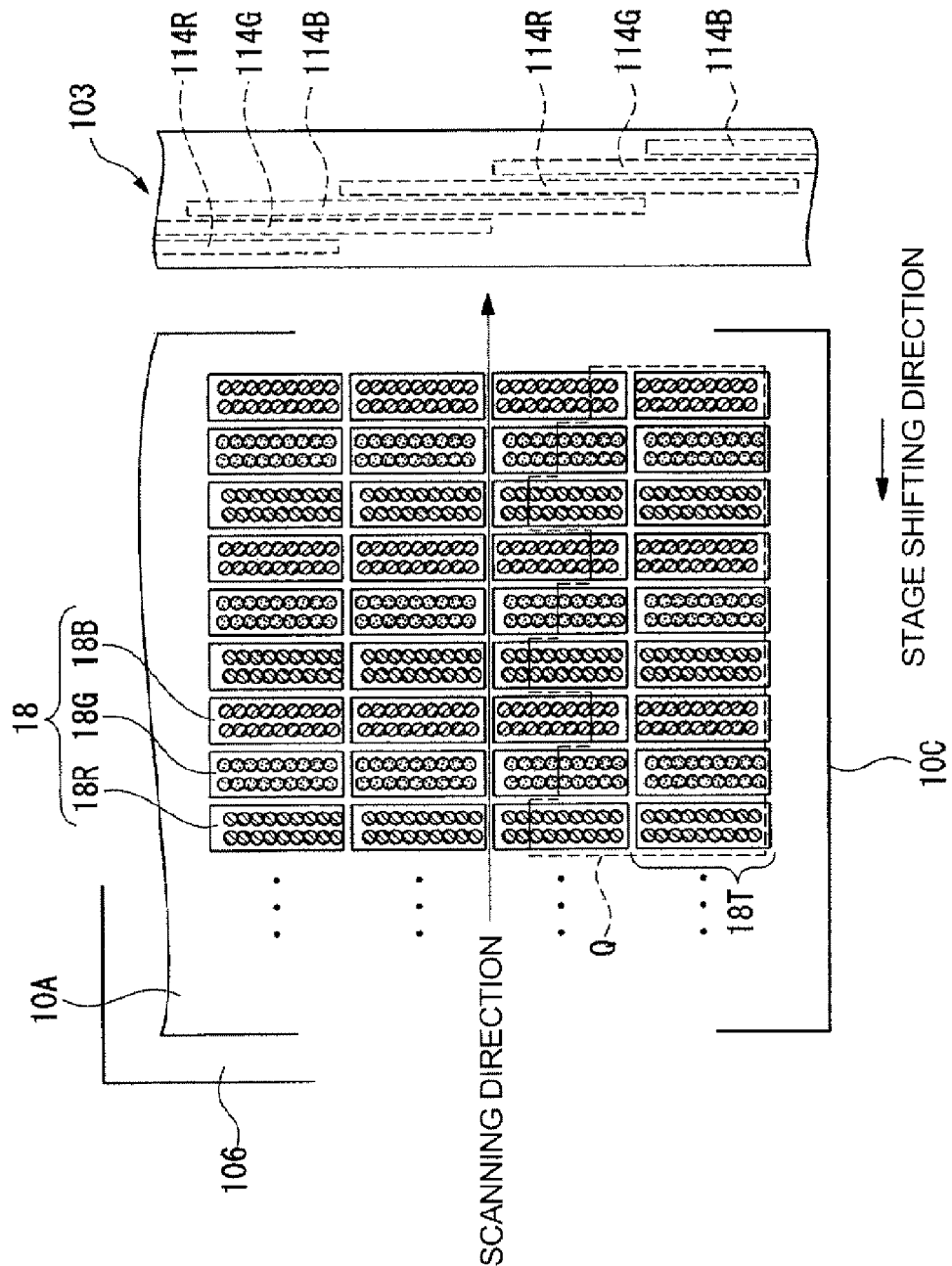
FIG. 12 is a third drawing illustrating a method for discharging droplets employed in the embodiment.

From the second scan on, the carriage 103 moves sequentially to the rest of the coated areas 18 where the liquid material 111 has not yet been discharged, and conducts discharge while reciprocating over the coated areas 18. It repeats the scanning until liquid material 111 is discharged to all the coated areas 18, as shown in FIG. 12. The discharge on coated areas 18T, provided along a side 10C that faces the side edge 10B, is performed using the nozzles 118 arranged in the overlapped discharge area V and in the upper part of the overlapped discharge area V in the figure. Here, the discharge area looks like an area Q, surrounded by a dotted line, indicated in FIG. 12. The discharge to the coated areas 18T may either be conducted in the last sequence of scanning, or in the middle.

Processes thereafter will be briefly described. Electrodes and metal patterns (not shown) are formed on the substrate 10A on which the color filter 16 is formed, forming a planarization film. Spacers and isolation walls (not shown) are also formed on the surface of the substrate 10A for controlling gaps. Thereafter, the orientation film is formed so as to cover the metal patterns and color filter formed on the substrate 10A, and this orientation film is rubbed. The orientation film may be formed by, for instance, coating or printing polyimide. Sealing material, formed with epoxy resin or the like, is formed in a rectangular loop, and the liquid crystal is coated on to the area surrounded by the sealing material.

Subsequently, the active matrix side motherboard is formed by: forming electrodes and metal patterns on the large-sized substrate formed with translucent material such as glass or plastic; and forming a planarization film on the area where the metal patterns and electrodes are formed. After forming the planarization film, the orientation film, formed with polyimide or the like, is formed and rubbed.

Thereafter, the motherboard in the color filter side and the motherboard in the active matrix side are adhered together as a panel. To achieve this, the two boards are brought closer, and the motherboard in the active matrix side is adhered to the sealing material on the motherboard in the color filter side. Then the scribe line is formed on the adhered motherboards; the panel is sawn along the scribe line; the sawn panels are washed; and units such as drivers are packaged on each of the panels. Finally, the liquid crystal device 1 is completed by adhering a polarizing plate on the outer surface of each of the liquid crystal panels, followed by installing the back light 41.

As described, with this embodiment, the location where the uneven coating line is likely to occur in each of the heads 114, or in other words, the location of the reference nozzles 118R in each of the heads 114, is shifted for each of the heads 114 in the direction of X-axis. Hence, the locations of the uneven coating lines of the liquid material 111 discharged from each of the heads 114 do not overlap, when the carriage 103 discharges the liquid material 111 while it scans over the substrate 10A, making the overall uneven coating lines of the liquid material less conspicuous.

In the case where the nozzles 118 are shifted as described above, the discharge regions fluctuate for each of the heads 114. Particularly, only one, or some of the variations of the liquid materials 111 are discharged on the coating areas 18S provided on the edge side 10B of the substrate 10A. In this case, the scan needs to be repeated twice or three times, which is very inefficient, just in order to discharge other types of the liquid material 111 that have not been discharged on the needed area in the first scan.

According to the embodiment, the scan is performed so that the overlapped discharge area V includes at least a part of the coated areas 18S, when discharging the liquid material 111 to the coated areas 18S provided on edge side 10B of the substrate 10A. Thus, one scan allows the discharge of all three types of the liquid material 111 on the coated areas 18S. This provides an advantage of avoiding an inefficient scanning.

In the above-mentioned embodiment, the size $L_v$ in the direction of the X-axis in the overlapped discharge areas V is larger than the size L of the coated areas 18S in the direction of the X-axis. Consequently, one scan allows the discharge of the liquid material 111 on the entire coated areas 18S in the direction of the X-axis, voiding the discharge two or three times on the same coated areas 18S. This also means that no time lag exists in the case of discharging on one of the coated areas 18S once and, after reciprocating the scan, discharging on the same area again, thereby allowing a prevention of uneven drying of the liquid material 111, caused by the discharge time lag.

Moreover, according to the above-mentioned embodiment, by discharging the liquid material 111, first, on (for instance)

the coated areas 18S out of the entire coated areas 18, as shown in FIG. 10, the adjustment of the location of the heads 114, during the later scanning over other coated areas 18, becomes easier, allowing an efficient scanning.

Electronic Apparatus

The electronic appliance according to the embodiment of the present invention will now be described using a mobile phone as an example.

Figure 13:
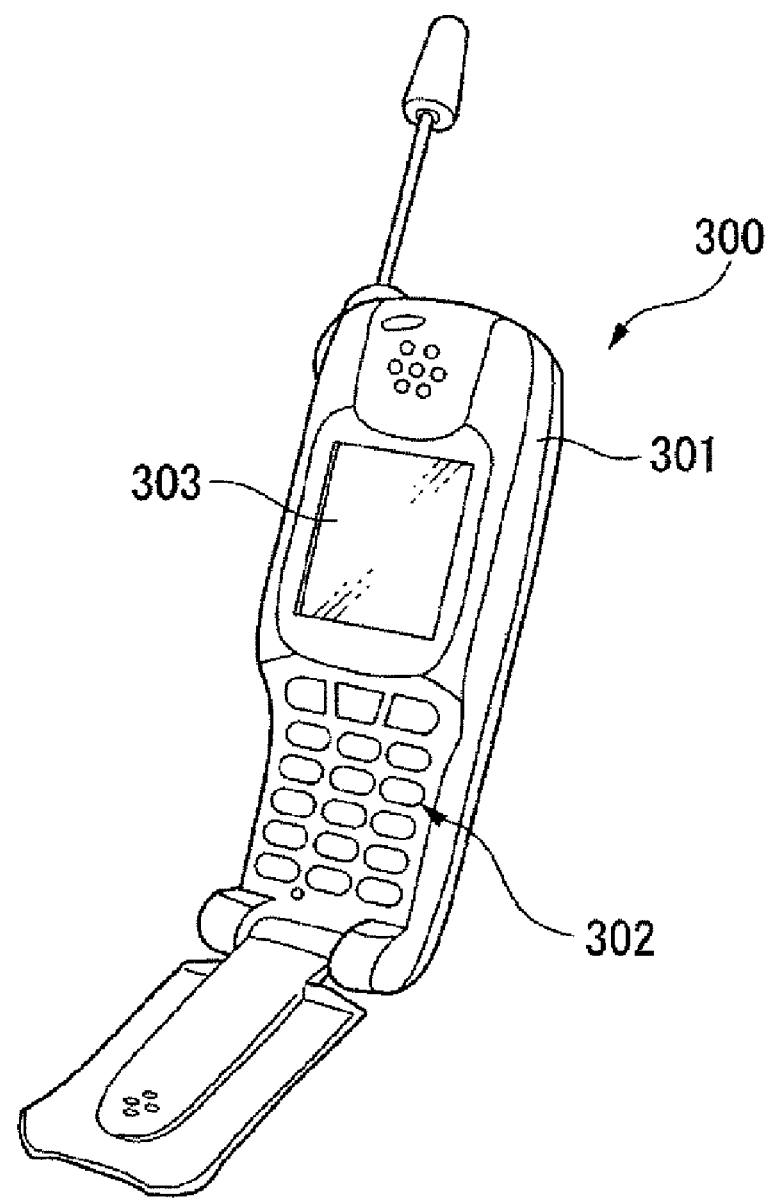
FIG. 13 is an oblique drawing illustrating the structure of an electronic apparatus according to the embodiment of the invention.

FIG. 13 is an oblique drawing illustrating an overall structure of a mobile phone 300.

The mobile phone 300 includes a body 301, an operation unit 302 in which a plurality of operation buttons are installed, and a display unit 303 that displays images, movies, and characters. The liquid crystal device 1 according to the embodiment of the invention is mounted on the display unit 303.

Mounting the liquid crystal device 1 with a high and even display quality allows obtaining an electronic apparatus (the mobile phone 300) that has excellent display functionality.

The scope of technology according to the present invention shall not be limited to the above-mentioned aspects and embodiment, and allows appropriate modifications without departing from the main scope of the invention.

Moreover, the descriptions of the above-mentioned embodiment only describe the example in the case of forming the color filter 16 on the color filter substrate 3 of the liquid crystal device 1. However, the examples are not limited to this, and another example can be applied to the case of, for instance, forming an organic layer (light emitting layer, etc.) on a substrate for an organic electroluminescence device.

What is claimed is:

1. A method for discharging droplets onto a discharge area, the discharge area including an edge portion, the method comprising:
providing a plurality of discharge heads, each with a plurality of nozzles, the plurality of discharge heads being moveable in a scanning direction relative to the discharge area, the plurality of discharge heads being spaced apart relative to each other in a first direction, the plurality of heads being offset relative to each other in a second direction substantially perpendicular to the first direction, the plurality of discharge heads having an overlapped area where the plurality of discharge heads overlap each other when viewed from the scanning direction;
discharging droplets of a plurality of different functional liquids from the plurality of discharge heads; and
moving the plurality of discharge heads in the scanning direction relative to the discharge area such that the overlapped areas scan the edge portion of the discharge area in a single pass, and such that the nozzles of the overlapped areas discharge droplets of the plurality of different functional liquids onto the edge portion in the single pass, the single pass being a continuous, unidirectional movement of the plurality of discharge heads relative to the discharge area.

2. The method of claim 1, wherein at least one of the plurality of discharge heads includes an outer nozzle located outside the respective overlapped area, and further comprising withholding discharge of the respective functional liquid from the outer nozzle during the single pass.

3. The method of claim 1, wherein at least one discharge head includes a first array of nozzles and a second array of nozzles, wherein each of the first and second array of nozzles extends in the second direction, wherein the first and second array of nozzles are spaced apart in the first direction, and wherein at least one nozzle from the first array and at least one nozzle from the second array discharges respective droplets in the single pass.

4. The method of claim 3, wherein the first and second array are offset relative to each other in the second direction.

5. The method of claim 1, wherein the overlapped area is defined between a first imaginary line and a second imaginary line, both extending substantially parallel to the scanning direction, the first imaginary line intersecting a first nozzle closest to an end of a first discharge head, the second imaginary line intersecting a second nozzle closest to an opposite end of a second discharge head.

6. The method of claim 1, wherein the discharge area includes a plurality of coated areas that are spaced apart from each other and that are arranged in a plurality of rows, the plurality of rows extending parallel to the scanning direction, wherein the overlapped areas are large enough to span across a first coated area in a first row and a second coated area in a second row in the single pass, and further comprising discharging droplets on the first and second coated areas in the single pass.

7. The method of claim 6, wherein an intermediate nozzle is located between the first and second coated areas, and further comprising withholding discharge of the respective functional liquid from the intermediate nozzle during the single pass.

8. The method of claim 1, wherein the single pass is a first pass in which the droplets are discharged onto the discharge area.

9. The method of claim 1, wherein the different functional liquids differ in color.

10. The method of claim 1, further comprising moving the plurality of discharge heads relative to the discharge area in a direction transverse to the scanning direction, moving the plurality of discharge heads relative to the discharge area parallel to the scanning direction in a second pass, and discharging droplets of the plurality of different functional liquids during the second pass to deposit the droplets on a different portion of the discharge area.

11. The method of claim 1, wherein the edge portion of the discharge area includes a plurality of coated areas that are spaced apart to extend along the edge portion, and further comprising moving the plurality of discharge heads in the scanning direction relative to the discharge area such that the overlapped areas scan all of the plurality of coated areas extending along the edge portion, and such that the overlapped areas discharge droplets of the plurality of different functional liquids onto each of the plurality of coated areas extending along the edge portion in the single pass.

12. A method for discharging droplets, comprising:
providing a plurality of discharge heads that are parallel to a predetermined direction and shifted relative to one another in a direction substantially orthogonal to the predetermined direction so that each of the plurality of discharge heads has an overlapped portion where the plurality of discharge heads overlap each other when viewed from a scanning direction, each discharge head including a plurality of nozzles;
moving the plurality of discharge heads relative to a discharge area of a substrate in a single pass, the single pass being a continuous, unidirectional movement of the plurality of discharge heads relative to the discharge area; and
discharging a plurality of different functional liquids from the plurality of nozzles onto the discharge area in the single pass,
wherein the overlapped portions of the discharge heads scan an edge portion of the discharge area in the single pass, the edge portion extending in the scanning direction.

13. The method of claim 1, wherein the different functional liquids differ in color, and wherein the nozzles for each of the different colors of the functional liquids in the overlapped areas are aligned in the scanning direction.

14. The method of claim 12, wherein the different functional liquids differ in color, and wherein the nozzles for each of the different colors of the functional liquids in the overlapped areas are aligned in the scanning direction.

* * * * *